United States Patent
Finkbeiner et al.

(10) Patent No.: US 8,687,255 B2
(45) Date of Patent: Apr. 1, 2014

(54) METHOD FOR MANUFACTURING A MICROMECHANICAL COMPONENT, AND MICROMECHANICAL COMPONENT

(75) Inventors: Stefan Finkbeiner, Pittsburgh, PA (US); Tjalf Pirk, Stuttgart (DE); Christoph Friese, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 452 days.

(21) Appl. No.: 13/057,411

(22) PCT Filed: Jul. 6, 2009

(86) PCT No.: PCT/EP2009/058504
§ 371 (c)(1),
(2), (4) Date: May 19, 2011

(87) PCT Pub. No.: WO2010/018029
PCT Pub. Date: Feb. 18, 2010

(65) Prior Publication Data
US 2011/0279919 A1    Nov. 17, 2011

(30) Foreign Application Priority Data
Aug. 12, 2008  (DE) .................... 10 2008 041 178

(51) Int. Cl.
G02B 26/08    (2006.01)

(52) U.S. Cl.
USPC .................... 359/224.1; 359/199.2; 359/900; 438/72

(58) Field of Classification Search
USPC .......... 359/198.1–199.4, 200.6–200.8, 221.2, 359/223.1–224.2, 291, 298, 295; 310/309; 257/414; 438/8, 69, 72, 689–692, 707, 438/708, 719, 723
See application file for complete search history.

(56) References Cited

U.S. PATENT DOCUMENTS

| 5,948,981 | A | 9/1999 | Woodruff |
| 6,067,858 | A | 5/2000 | Clark et al. |
| 7,872,394 | B1 * | 1/2011 | Gritters et al. ................ 310/309 |

(Continued)

FOREIGN PATENT DOCUMENTS

| DE | 10334240 | 2/2005 |
| DE | 102006058563 | 6/2008 |

OTHER PUBLICATIONS

International Search Report, PCT International Patent Application No. PCT/EP2009/058504, dated Dec. 2, 2010.

*Primary Examiner* — James Phan
(74) *Attorney, Agent, or Firm* — Kenyon & Kenyon LLP

(57) ABSTRACT

A method for manufacturing a micromechanical component is described, including the steps of: forming a first etch stop layer on a base substrate, the first etch stop layer being formed in such a way that it has a first pattern of through-cutouts; forming a first electrode-material layer on the first etch stop layer; forming a second etch stop layer on the first electrode-material layer, the second etch stop layer being formed in such a way that it has a second pattern of through-cutouts differing from the first pattern; forming a second electrode-material layer on the second etch stop layer; forming a patterned mask on the second electrode-material layer; and carrying out a first etching step in a first direction and a second etching step in a second direction counter to the first direction in order to etch at least one first electrode unit out of the first electrode-material layer and to etch at least one second electrode unit out of the second electrode-material layer. Also described are micromechanical components.

9 Claims, 4 Drawing Sheets

(56) References Cited

U.S. PATENT DOCUMENTS

| | | |
|---|---|---|
| 2002/0159170 A1 | 10/2002 | Tsuboi et al. |
| 2003/0007262 A1* | 1/2003 | Tsuboi et al. ................ 359/847 |
| 2004/0250625 A1 | 12/2004 | Kogan et al. |
| 2005/0231805 A1 | 10/2005 | Shiozaki et al. |
| 2006/0115920 A1 | 6/2006 | Urano et al. |
| 2006/0169043 A1 | 8/2006 | McNeil |
| 2006/0186085 A1 | 8/2006 | Fuertsch |
| 2010/0085622 A1 | 4/2010 | Hofmann et al. |

* cited by examiner

METHOD FOR MANUFACTURING A MICROMECHANICAL COMPONENT, AND MICROMECHANICAL COMPONENT

FIELD OF THE INVENTION

The present invention relates to a method for manufacturing a micromechanical component. In addition, the present invention relates to a micromechanical component.

BACKGROUND INFORMATION

A micromechanical component often has a setting element, which is joined to a frame mount by way of at least one spring. For example, an electrostatic drive is used to adjust the setting element relative to the frame mount. A specific embodiment of such a micromechanical component is a micromirror as is often used in light-projection apparatuses or in optical communications technology.

An electrostatic drive frequently has two comb electrodes, which are patterned separately from each other and then aligned relative to each other in a desired position. However, because of the small size of the comb electrodes, problems frequently arise during the fine adjustment of the comb electrodes relative to each other. As an alternative, the possibility of producing the two comb electrodes from one SOI (Silicon-On-Isolator) substrate is conventional. However, the production of a suitable SOI substrate is relatively costly.

A further problem in manufacturing a micromechanical component lies in the disposition of the at least one spring on the setting element. In order to permit easy adjustment of the setting element, the at least one spring should have a low bending stiffness, preferably a low torsional stiffness, in one desired bending direction. Therefore, a specific minimum length of the at least one spring is advantageous in terms of the lowest possible bending stiffness of the spring. At the same time, however, the use of the setting element and the spring in the micromechanical component requires that the setting element, with the spring mounted on it, be mountable within a volume having a comparatively small extension.

SUMMARY

In accordance with the present invention, small structures are producible in an advantageous configuration relative to each other, by covering suitably patterned etch stop layers as buried structures by two electrode-material layers. The structures determined may subsequently be etched out of the two electrode-material layers with the aid of two etching steps. Preferably, after the two etching steps, the structures are already in an advantageous operating position relative to each other. This reduces the expenditure for implementation of the manufacturing method, and thus lowers the costs for the finished produced micromechanical component.

In this context, it is possible to produce the two electrode units using a standard process. This additionally reduces the manufacturing costs, and at the same time increases the yield rate of the manufacturing method.

For example, the first electrode-material layer and/or the second electrode-material layer is/are formed as polysilicon layers with the aid of an epitaxial deposition process, and/or the first etch stop layer and/or the second etch stop layer is/are formed of silicon oxide. In this manner, suitable layers for the etching of the electrode units may be formed with a comparatively modest expenditure.

In particular, the mask on the second electrode-material layer may be patterned in such a way that it has a third pattern of through-cutouts which differs from the first pattern and the second pattern. For example, at least one partial surface of the second etch stop layer is formed in such a way that it has equidistantly disposed cutouts having identical extensions, the distance between the equidistant cutouts corresponding to the width of the electrode fingers of the first electrode unit and of the second electrode unit. In addition, at least one partial surface of the first etch stop layer may be formed in such a way that it has equidistantly disposed cutouts having identical extensions, the spacing and the extensions of the equidistantly disposed cutouts being determined in such a way that, given a projection of the partial surface of the second etch stop layer onto the partial surface of the first etch stop layer, every second intermediate area between the equidistantly disposed cutouts of the partial surface of the second etch stop layer is projected onto a cutout in the partial surface of the first etch stop layer.

With the aid of the example method described above, it is possible to etch two comb electrodes, disposed in parallel and offset relative to each other (out-of-plane) for a quasi-static operation of a micromechanical component, starting from only one mask level. This allows a more precise production of the two comb electrodes without alignment errors, especially a smaller width of the electrode fingers of the comb electrodes. Because of the reduced width of the electrode fingers and the simultaneously reduced diameter of the electrode-finger interspaces, the electrostatic force between the two comb electrodes is increased, accompanied by constant voltage. In addition, the etching of the two comb electrodes using a shared etching mask ensures a more compact type of construction of the comb electrodes. Thus, the method described offers an easily feasible possibility for producing an especially advantageous electrostatic drive.

In one advantageous further refinement, the first etch stop layer and/or the second etch stop layer is/are made up of at least one bottom insulating layer, a middle conductive layer which at least partially covers the bottom insulating layer, and a top insulating layer at least partially covering the middle conductive layer. The middle conductive layer may take the form of at least one conductor. Thus, the method described here also ensures an easily practicable application of conductors for the contacting of the two electrode units.

In one especially advantageous further development, the example manufacturing method includes the additional steps of: Forming a mirror plate at least partially from the second electrode-material layer, and forming a base element, fixedly disposed on a bottom side of the mirror plate, at least partially from the first electrode-material layer; forming a frame mount; and forming a spring, via which the mirror plate is joined to the frame mount, at least partially from the first electrode-material layer, the spring being attached to the base element in such a way that the spring runs at least partially along the bottom side of the mirror plate, and the mirror plate is adjustable relative to the frame mount.

This invention is based on the finding that by at least partially locating the at least one spring on the base element placed below the mirror plate, the space required by the mirror plate, the base element and the spring attached to it may be reduced, although the at least one spring may have a comparatively great length. This makes it possible to reduce the size of the micromechanical component, while ensuring an advantageous bending stiffness of the at least one spring for adjusting the mirror plate.

Thus, the present invention permits a comparatively compact implementation of a biaxial suspension of a mirror plate. In addition to the comparatively low manufacturing costs, a small type of construction of the micromechanical component with the at least one relatively long spring disposed therein is ensured.

In one preferred specific embodiment, a first rotational axis, about which the mirror plate is adjustable, runs through the spring; a second rotational axis, about which the mirror plate is adjustable, runs through at least one bar element of the frame mount; and the second rotational axis is aligned so as to be inclined by an angle unequal to 90° with respect to the first rotational axis. In this manner, the size of the micromechanical component may be further reduced.

In another preferred specific embodiment, the second rotational axis, about which the mirror plate is adjustable, runs parallel to a center axis of the mirror plate at a distance unequal to 0 with respect to the center axis of the mirror plate. This ensures a limitation of the maximum deflection of frame mount 148 and of the mass moment of inertia.

BRIEF DESCRIPTION OF THE DRAWINGS

Further features and advantages of the present invention are explained below with reference to the figures.

DETAILED DESCRIPTION OF EXAMPLE EMBODIMENTS

FIG. 1A to 1D show cross-sections through a substrate to illustrate a first specific example embodiment of the manufacturing method.

Figure 1A:
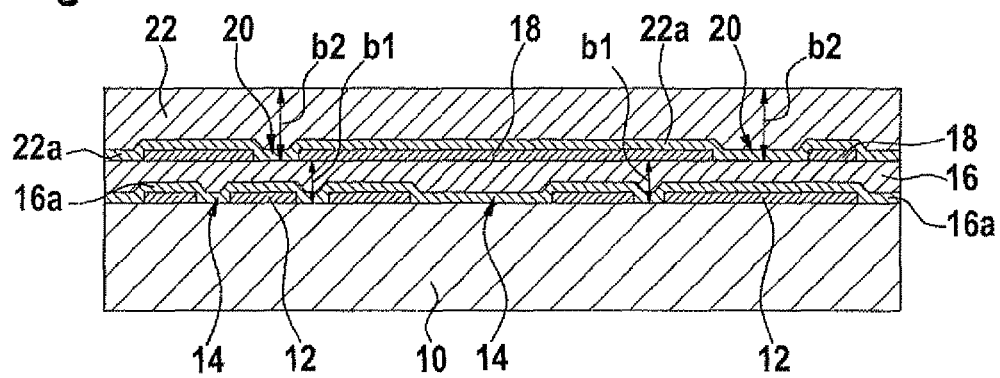
FIG. 1A to 1D show cross-sections through a substrate to illustrate a first specific embodiment of the manufacturing method.

FIG. 1A shows a cross-section through a substrate, made up of a base substrate 10, two etch stop layers 12 and 18 and two electrode-material layers 16 and 22, along a plane perpendicular to a top side of the substrate.

In a first step of the example manufacturing method, a first etch stop layer 12 is formed on the top side of base substrate 10. For example, base substrate 10 is a silicon substrate. Preferably, base substrate 10 has monocrystalline silicon.

First etch stop layer 12 may be an oxide layer. In particular, first etch stop layer 12 may be formed by thermal oxidation of a base substrate 10 produced from silicon.

Subsequently, a first pattern of through-cutouts 14 is formed in first etch stop layer 12. Through-cutouts 14 have a maximum depth which is equal to the layer thickness of first etch stop layer 12. Since methods for patterning a layer from the material of first etch stop layer 12 are known from the related art, it is not discussed in greater detail here.

A first electrode-material layer 16 is formed on first etch stop layer 12 having the first pattern of cutouts 14. First electrode-material layer 16 covers first etch stop layer 12 completely, and in addition, fills cutouts 14. First electrode-material layer 16 is preferably an epitaxial polysilicon layer which is produced with the aid of an epitaxial deposition process using an epi-start layer 14a. In this context, the bottoms and walls of cutouts 14 and the top side of patterned etch stop layer 12 are first covered with thin epi-start layer 14a. Subsequently, first electrode-material layer 16 is formed using one of the known methods. The surface of first electrode-material layer 16 may be polished using a chemical-mechanical polishing method. At the same time, a first layer thickness b1 of first electrode-material layer 16 may be reduced to a value which corresponds to the desired width of the comb electrode formed later from first electrode-material layer 16.

A second etch stop layer 18 is applied on first electrode-material layer 16. Second etch stop layer 18 may contain the material of first etch stop layer 12. Second etch stop layer 18 is patterned so that it has a second pattern of through-cutouts 20. Second etch stop layer 18 is patterned in such a way that the second pattern of second etch stop layer 18 differs from the first pattern of first etch stop layer 12. This may also mean that either first etch stop layer 12 or second etch stop layer 18 has no through-cutouts, in contrast to the other etch stop layer 12 or 18.

In a further method step, a second electrode-material layer 22 is applied on the top side of second etch stop layer 18. Second electrode-material layer 22 may likewise be formed in an epitaxial deposition process as an epitaxial polysilicon layer using a second epi-start layer 22a. The surface of second electrode-material layer 22 may be smoothed with the aid of a chemical-mechanical polishing method, and a second layer thickness b2 may be reduced to a value desired for a width of a comb electrode formed later from second electrode-material layer 22. The result is shown in FIG. 1A.

A front-side etching and a back-side etching are carried out to etch the two comb electrodes out of electrode-material layers 16 and 22. Merely by way of example, in the manufacturing method described here, the back side is etched prior to etching the front side. For example, the back-side etching and/or the front-side etching may include a further step for etching the exposed etch stop layers.

To etch the back side, a bottom mask 24, e.g., a photoresist mask, is applied on a bottom side of base substrate 10 in opposite direction of first etch stop layer 12, and patterned. Preferably, bottom mask 24 is patterned using a lithographic process. In so doing, bottom mask 24 is patterned in such a way that it has a third pattern of through-cutouts. The third pattern of cutouts in bottom mask 24 may differ from the first pattern of first electrode-material layer 16 and the second pattern of second electrode-material layer 22.

Figure 1B:
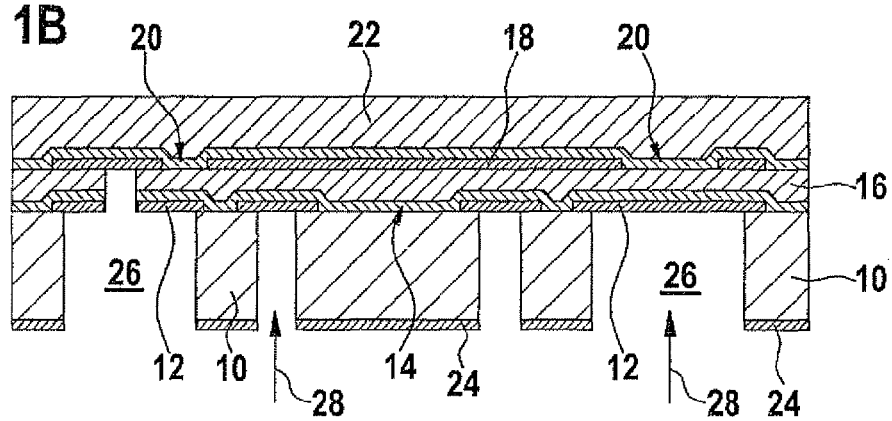

Next, cavities 26 are etched into base substrate 10 using a suitable etching material. The back side is etched in a first direction 28 which preferably is directed perpendicular to the bottom side of base substrate 10. The etching material for etching the back side must be selected in such a way that it scarcely attacks bottom mask 24, first etch stop layer 12 and second etch stop layer 18. During the back-side etching, first etch stop layer 12 is used as mask for first electrode-material layer 16. If a cavity 26 meets a cutout 14 in first etch stop layer 12, etching of first electrode-material layer 16 is thus not prevented. In this case, etched cavity 26 extends through first electrode-material layer 16, as shown in FIG. 1B. The time for etching the back side is preferably selected to be of sufficient length to permit a maximum depth of cavities 26 equal to the total layer thickness of layers 10, 12 and 16.

Prior to etching the front side, the surface of second electrode-material layer 22 is at least partially covered by a top mask 30. Top mask 30 may likewise be a photoresist mask. In particular, using a lithographic process, top mask 30 may be patterned in such a way that it has a fourth pattern of through-cutouts. The fourth pattern may deviate from the first pattern of first etch stop layer 12, the second pattern of second etch stop layer 18 and/or the third pattern of bottom mask 24.

Figure 1C:
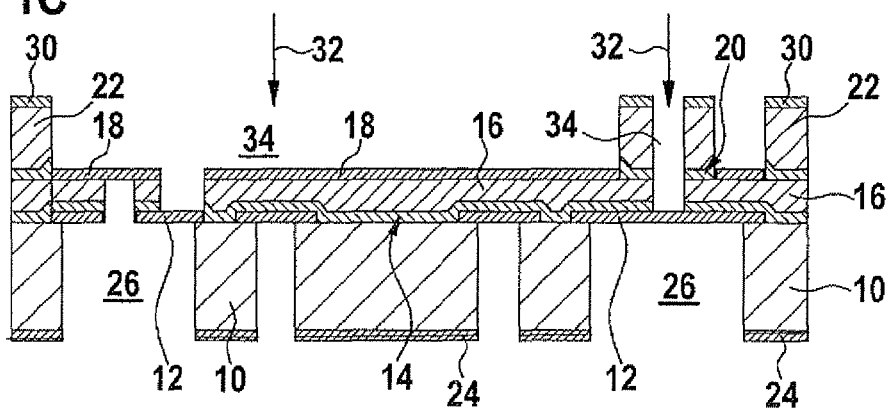

Thereupon, the front side is etched in a second direction 32 differing from first direction 28. Preferably, second direction 32 is directed perpendicular to the surface of base substrate 10. In particular, first direction 32 of the front-side etching may be determined to be counter to direction 28 of the back-side etching. The etching material for etching the front side must be selected in such a way that top mask 30, first etch stop layer 12 and second etch stop layer 18 are scarcely etched. Cavities 34 are etched only into the areas of second electrode-material layer 22 not covered by top mask 30. If the bottom of a cavity 34 is not completely covered by second etch stop layer 18, then first electrode-material layer 16 is also etched in the area in question. The time for etching the front side may be selected to be sufficiently long for that purpose. FIG. 1C shows the substrate after the front side etching is completed.

Figure 1D:
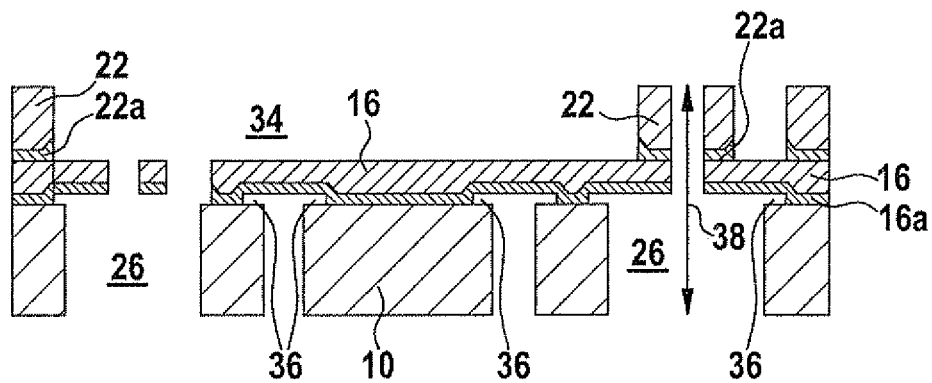

The remainders of etch stop layers 12 and 18 and/or of masks 24 and 30 may be removed in a subsequent oxide etching step. The undercutting in gaps 36 accomplished in this manner may also release previously fixed areas of layers 10, 16 and/or 22. In addition, at least one channel 38 may thus be formed, which extends through the entire breadth of layers 10, 16 and 22. The result of the oxide etching step is shown in FIG. 1D.

The method described with reference to FIG. 1A through 1D offers the possibility of producing electrode units or other elements of a micromechanical component with the aid of two easily executable etching steps, using etch stop layers 12 and 18 as buried structures. Preferably, in so doing, the electrode units and/or other elements are produced in a position relative to each other which corresponds to an advantageous operating position. Various examples for using the method described here are explained below.

Figure 2:
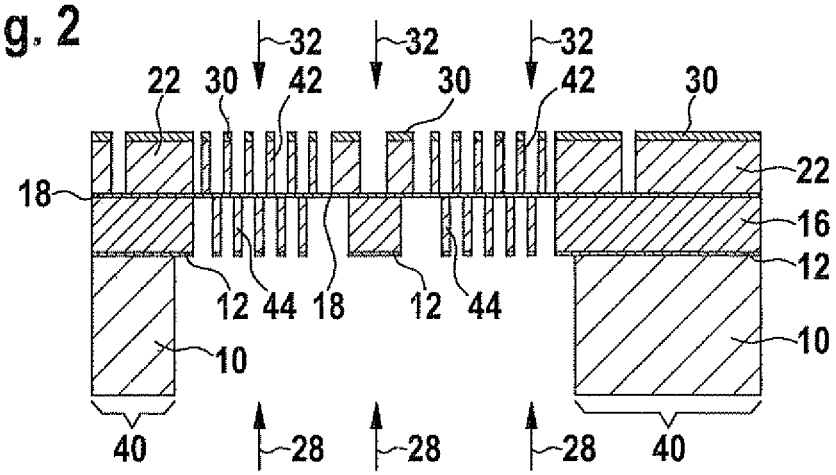
FIG. 2 shows a cross-section through a first specific embodiment of the micromechanical component.

FIG. 2 shows a cross-section through a first specific embodiment of the micromechanical component. For instance, the micromechanical component shown may be a micromirror. However, for the sake of better clarity, neither an adjustable setting element nor a spring is shown in FIG. 2. In the same way, etch stop layers 12 and 18 are not yet removed, which, however, may be done in a method step carried out later.

The micromechanical component shown may be produced by the manufacturing method described above in connection with FIG. 3. 1A through 1C. In so doing, the patterns of patterned etch stop layers 12 and 18 and of top mask 30 and of the (not shown) bottom mask are selected in such a way that at least one frame part 40, a first comb electrode 42 and a second comb electrode 44 are etched out of base substrate 10 and the two electrode-material layers 16 and 22 by back-side etching in direction 28 and front-side etching in direction 32.

In particular, first electrode-material layer 16 and/or second electrode-material layer 22 may be epitaxial polysilicon layers. To that end, at least one (not shown) epi-start layer is formed on first etch stop layer 12 and/or on second etch stop layer 18 by an epitaxial deposition process.

Using the manufacturing method described above, the two comb electrodes 42 and 44 may easily be produced so as to already be in a suitable configuration relative to each other. Consequently, it is no longer necessary to adjust the two comb electrodes 42 and 44 into the desired position relative to each other after they have been produced. No SOI substrate is required to produce the micromechanical component shown. This reduces the costs for manufacturing the micromechanical component. In addition, only two etching steps are performed to produce the two comb electrodes 42 and 44.

Since the two etching steps are performed after layers 10 through 22 are assembled, the finished etched electrode fingers of the two comb electrodes 42 and 44 are already joined to a compact structure, e.g., to frame part 40. The electrode fingers of both comb electrodes 42 and 44 are therefore protected from bending and/or from damage due to their touch contact with the compact structure. Naturally, etch stop layers 12 and 18 and top mask 30 shown in FIG. 2 may be removed in a later step of the manufacturing method.

Figure 3:
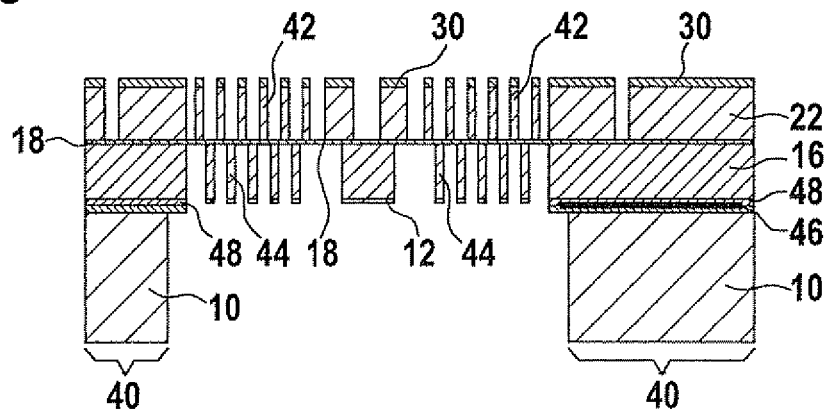
FIG. 3 shows a cross-section through a second specific embodiment of the micromechanical component.

FIG. 3 shows a cross-section through a second specific embodiment of the micromechanical component. The micromechanical component shown has components 40 through 44 already described in the micromechanical component of FIG. 2. In addition, the micromechanical component shown is producible by a manufacturing method which has the steps described on the basis of FIG. 1A through 1C. Etch stop layers 12 and 18 may be removed in a further method step.

As supplementary method steps of the manufacturing method, a heavily doped polysilicon layer 46 is formed on first etch stop layer 12 prior to applying first electrode-material layer 16. Heavily doped polysilicon layer 46 is subsequently covered with an insulating layer 48 that is selectively patterned. Preferably, in so doing, through-cutouts are formed up to heavily doped polysilicon layer 46. Only then is first electrode-material layer 16 formed on insulating layer 48.

Heavily doped polysilicon layer 46 is patterned in such a way that it is usable as at least one buried printed circuit trace for the selective and hermetically sealed contacting of areas of bottom comb electrode 44 in the finished produced micromechanical component. Of course, a printed circuit trace may also be formed on second etch stop layer 18 and used, for example, for the contacting of top comb electrode 42 of the finished produced micromechanical component.

Figure 4A:
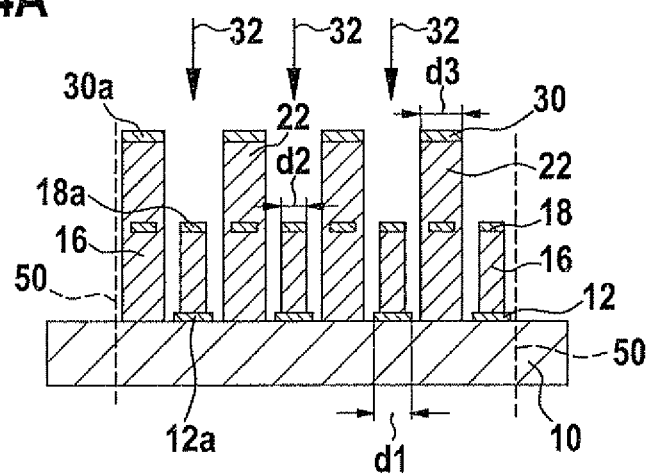
FIG. 4A to 4B show cross-sections through a substrate to illustrate a second specific embodiment of the manufacturing method.
Figure 4B:
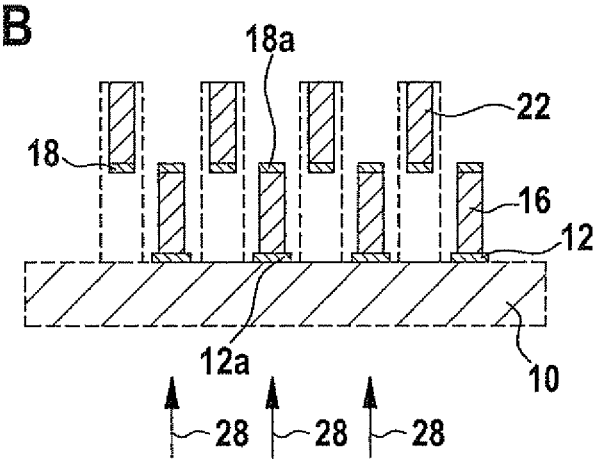

FIG. 4A to 4B show cross-sections through a portion of a substrate to illustrate a second specific embodiment of the manufacturing method.

According to the example method described in connection with FIG. 1A, a patterned first etch stop layer 12, a first electrode-material layer 16, a patterned second etch stop layer 18 and a second electrode-material layer 22 are formed on a base substrate 10. First electrode-material layer 16 and/or second electrode-material layer 22 may be epitaxial polysilicon layers which are produced by an epitaxial deposition process using an epi-start layer (not shown).

First etch stop layer 12 has a first pattern of through-cutouts (without reference numeral). A second pattern of through-cutouts is formed in second etch stop layer 18, as well. The first pattern of first etch stop layer 12 differs from the second pattern of second etch stop layer 18.

Boundary lines 50 running in a direction perpendicular to the surface of base substrate 10 define a volume of the micromechanical component subsequently produced, within which volume the electrode fingers of a first and a second comb electrode are formed. For this reason, a partial surface of first etch stop layer 12 within boundary lines 50 has a first pattern of equidistant cutouts, each of the cutouts having the same extension. Correspondingly, a partial surface of second etch stop layer 18 within boundary lines 50 also has a second pattern of equidistant cutouts of equal extension.

A top mask 30, e.g., a photoresist mask, is applied on second electrode-material layer 22. Preferably with the aid of a lithographic process, top mask 30 may be patterned in such a way that it has a third pattern of through-cutouts. The third pattern of patterned mask 30 differs from the first pattern of patterned first etch stop layer 12 and the second pattern of patterned second etch stop layer 18.

Within boundary lines 50, a partial surface of top mask 30 is also formed in such a way that the cutouts of equal length and equal width are disposed equidistantly relative to each other. Preferably, distance d1 between two cutouts in the partial surface of first etch stop layer 12 defined by boundary lines 50 is equal to distance d3 between two cutouts in the partial surface of top mask 30 defined by boundary lines 50. First etch stop layer 12 and top mask 30 may be patterned in such a way that distances d1 and d3 still lie markedly above the minimal possible step size (resolution) of the patterning process used. As explained more precisely hereinafter, distances d1 and d3 are preferably selected in such a way that they take alignment inaccuracies, especially the control accuracy when patterning two layers applied one upon the other, into consideration.

Distance d2 between two cutouts in the partial surface of second etch stop layer 18 defined by boundary lines 50 corresponds to the width of the electrode fingers produced subsequently from electrode-material layers 16 and 22. Second etch stop layer 18 is preferably patterned in such a way that distance d2 corresponds to the minimal resolution of the patterning method employed. The smallest possible width of the electrode fingers produced is ensured in this manner.

Intermediate areas 12a and 30a between the cutouts in first etch stop layer 12 and top mask 30 within boundary lines 50 determine whether an electrode finger subsequently formed is etched out of electrode-material layer 16 or out of electrode-material layer 22. To that end, intermediate areas 12a and 30a are disposed relative to intermediate areas 18a between the cutouts in second etch stop layer 18 within boundary lines 50 in such a way that each intermediate area 18a is covered either by an intermediate area 12a or by an intermediate area 30a. This means that, given a projection of intermediate areas 18a in a direction parallel to boundary lines 50 onto first etch stop layer 12, every second intermediate area 18a strikes an intermediate area 12a, and every second intermediate area 18a strikes a cutout formed in first etch stop layer 12. In this context, disposed between two intermediate areas 18a, to which two intermediate areas 12a are assignable, is exactly one intermediate area 18a, to which one cutout formed in first etch stop layer 12 is assignable. Correspondingly, given a projection of intermediate areas 18a in the direction parallel to boundary lines 50 onto top mask 30, every second intermediate area 18a strikes an intermediate area 30a, and every second intermediate area 18a strikes a cutout formed in top mask 30. Disposed between two intermediate areas 18a, to which two intermediate areas 30a are assignable, is exactly one intermediate area 18a, to which one cutout formed in top mask 30 is assignable. In this context, either one intermediate area 12a or one intermediate area 30a is assignable to each of the intermediate areas 18a. The advantage of this patterning of etch stop layers 12 and 18 and of top mask 30 is described in greater detail below.

FIG. 4A shows a cross-section after the front side has been etched in direction 32. Direction 32 is preferably directed perpendicularly to the top side of base substrate 10.

As already explained above, during the front-side etching, both top mask 30 and second etch stop layer 18 are used for a selective formation of desired cavities within electrode-material layers 16 and 22. If, in so doing, partial surfaces of first electrode-material layer 16 are exposed which are not covered by second etch stop layer 18, then the etched cavities deepen down to the surface of first etch stop layer 12. Naturally, given a suitable patterning of first etch stop layer 12, it may also be used as mask for etching base substrate 10 during the front-side etching. In this case, the cavities etched by etching the front side extend into base substrate 10. The period of time for etching the front side may be set to be of sufficient length.

In etching the front side in direction 32, only the rough outlines of the comb electrodes later formed are determined. In particular, in etching the front side, only the electrode fingers of the bottom comb electrode subsequently produced are formed in their width. The electrode fingers of the top comb electrode are still protected by relatively large intermediate areas 30a of top mask 30 during the front-side etching.

FIG. 4B shows a cross-section after the back side has been etched in direction 28. Preferably, direction 28 is counter to direction 32 of the front-side etching.

The dashed lines in FIG. 4b show the outlines of base substrate 10 with electrode-material layers 16 and 22 formed on it after the front-side etching and prior to the back-side etching. During the back-side etching, base substrate 10 is removed. First etch stop layer 12 completely exposed in this manner is thus used as mask during the back-side etching. Areas of second etch stop layer 18 are also exposed by etching away areas of first electrode-material layer 16 whose bottom side is not covered by first etch stop layer 12. Thus, second etch stop layer 18 is also used as mask during the back-side etching.

Parts of comb electrodes 42 and 44 produced are shown with the aid of solid lines in FIG. 4b. The electrode fingers of comb electrodes 42 and 44 are the result of two etching steps in the two different directions 28 and 32, second etch stop layer 18 being used as mask in each of the two etching steps. Thus, the outlines of the finished produced electrode fingers of comb electrodes 42 and 44 are determined by the patterning of second etch stop layer 18. In this context, the width of the electrode fingers of comb electrodes 42 and 44 corresponds to distance d2.

Using the manufacturing method described here, it is therefore possible to define two comb electrodes 42 and 44, disposed in parallel and offset relative to each other, via a single mask, in this case, second etch stop layer 18. In so doing, the manufacturing method is of benefit, in that patterning of a single mask with high accuracy and the smallest possible step size is feasible in an easy manner. In contrast, in a conventional patterning of two superposed masks, during which high accuracy and the smallest possible step size are desired, problems occur, especially in the case of the alignment. These problems are able to be circumvented using the method described here.

When working with the method described herein, first etch stop layer 12 and top mask 30 may be patterned using a comparatively large step size. Because of the comparatively large step sizes, the patterning of superposed layers 12 and 30 no longer causes the problems usually occurring. In particular, in patterning layers 12 and 30, the step size may be selected in such a way that alignment inaccuracies, which occur when patterning two superposed layers, are taken into account.

In addition, after carrying out the manufacturing method described here, it is no longer necessary to adjust the two comb electrodes 42 and 44 relative to each other. Instead, after being etched, both comb electrodes 42 and 44 are already disposed so as to be slightly set apart, in parallel and offset relative to each other.

The implementation of the method described herein offers an easily executable possibility to produce comb electrodes 42 and 44 with a small width of the electrode fingers in an advantageous position relative to each other. The widths selected for the electrode fingers and the distances between two adjacent electrode fingers, which are able to be defined with high accuracy and good uniformity on second etch stop layer 18, are subsequently transferred automatically to the two comb electrodes 42 and 44. Furthermore, the spacing of the electrode fingers is equidistant, as predefined by second etch stop layer 18. This improves the precision compared to a conventional mask alignment.

The example manufacturing method described in above is not limited to a sequence of front-side etching and back-side etching. Likewise, the example manufacturing method is not limited to the manufacturing of two comb electrodes disposed in parallel and offset relative to each other (out-of-plane). In-plane comb electrodes are also able to be produced using the example manufacturing method.

Figure 5:
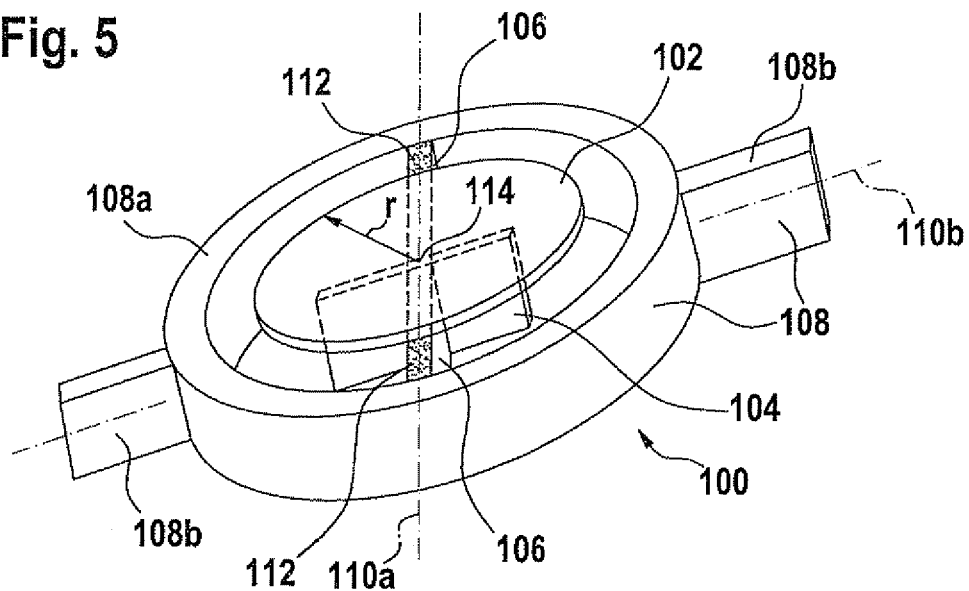
FIG. 5 shows a top view of a third specific embodiment of the micromechanical component.

FIG. 5 shows a top view of a third specific embodiment of the micromechanical component.

Micromechanical component 100 shown has a mirror plate 102 as adjustable setting element. Mirror plate 102 may have a circular top side having a radius r. For example, the top side of mirror plate 102 is coated with a reflective coating.

A base element 104 is attached to the bottom side of mirror plate 102. The length of base element 104 is somewhat less than double the radius r of mirror plate 102. The width of base element 104 is significantly less than the length of base element 104. A spring 106 is attached to each of the two sides of base element 104 which are aligned parallel to the longitudinal direction of base element 104.

Base element 104 is joined to a frame mount 108 via the two springs 106. Both springs 106 preferably take the form of torsion springs. Thus, mirror plate 102 and base element 104 are able to be adjusted with the aid of springs 106 about a first rotational axis 110a along the longitudinal direction of springs 106 relative to frame mount 108. Mirror plate 102 may be adjusted about first rotational axis 110a by a magnetic and/or electrostatic drive designed for that purpose. Moreover, the magnetic and/or electrostatic drive is designed to adjust mirror plate 102 about a second rotational axis 110b running in a direction perpendicular to first rotational axis 110a.

Frame mount 108 includes a circular frame 108a surrounding mirror plate 102, and two bar elements 108b projecting from frame 108a on both sides. Bar elements 108b run in the direction of second rotational axis 110b.

Micromechanical component 100 shown is able to be produced using the method described with reference to FIG. 1A through 1D. Preferably, in so doing, at least components 104, 106 and 108 are etched out of an electrode-material layer. In the process, electrode fingers may be formed on both bar elements 108b. For example, an etch stop layer may be applied as sacrificial layer 112 on the electrode-material layer which represents the material for components 104, 106 and 108. Mirror plate 102 is etched out of a layer applied on sacrificial layer 112. Prior to applying the layer from which later mirror plate 102 is etched, a cutout may be etched into sacrificial layer 112, preferably under a later midpoint 114 of mirror plate 102. After that, the material from which mirror plate 102 is later produced is applied directly onto the surface of base element 104. This ensures a good hold between mirror plate 102 and base element 104 later.

In FIG. 5, remainders of sacrificial layer 112 are still present on springs 106. However, as already described above, these remainders may be undercut prior to operation of micromechanical component 100.

Micromechanical component 100 has the advantage that mirror plate 102 and springs 106 are able to be disposed within a relatively small volume, although springs 106 have a comparatively great length. This advantage is ensured by drawing springs 106 beneath mirror plate 102. Springs 106 are therefore not attached to a lateral surface of mirror plate 102, but rather to base element 104 disposed underneath mirror plate 102.

Thus, even given a comparatively large surface of mirror plate 102 and relatively long springs 106, the overall frame size and therefore the costs for micromechanical component 100 are able to be reduced. In addition, this is beneficial with regard to the adjusting speed of mirror plate 102, since the mass moment of inertia is less.

Figure 6:
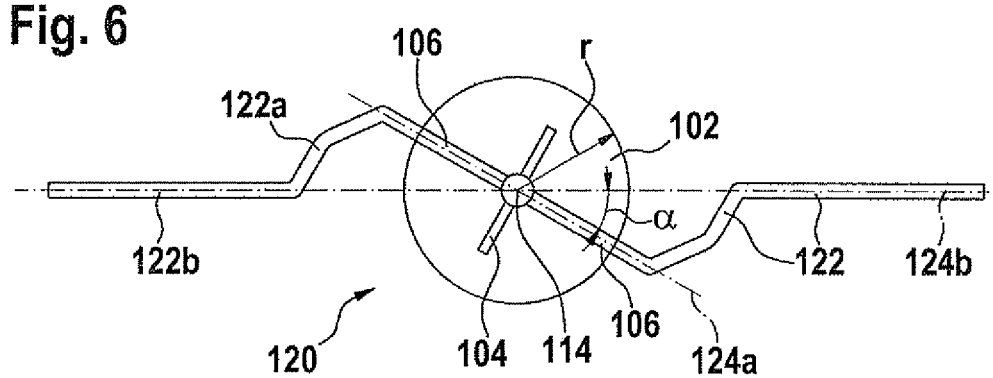
FIG. 6 shows a schematic representation of a fourth specific embodiment of the micromechanical component.

FIG. 6 shows a schematic representation of a fourth specific embodiment of the micromechanical component.

Micromechanical component 120 depicted has mirror plate 102 with base element 104 disposed under it, and springs 106 attached to base element 104. Consequently, micromechanical component 120 also has the advantage that, in spite of relatively long springs 106, mirror plate 102, together with springs 106 attached to base element 104, is able to be disposed within a comparatively small volume.

Preferably, to that end, both springs 106 are in the form of torsion springs. Mirror plate 102 is joined to a frame mount 122 via the two springs 106. With the aid of springs 106, mirror plate 102 is able to be rotated about a first rotational axis 124a relative to frame mount 122.

Frame mount 122 of micromechanical component 120 is made up of two sector frames 122a surrounding mirror plate 102 only by sector, and two bar elements 122b attached to sector frames 122a. While springs 106 determine first rotational axis 124a of mirror plate 102, a second rotational axis 124b of mirror plate 102 runs along the two bar elements 122b. In the case of micromechanical component 120, second rotational axis 124b is disposed at an angle α unequal to 90° and unequal to 0° with respect to first rotational axis 124a. This ensures the additional advantage that the components of micromechanical component 120 shown in FIG. 6 require less space.

Figure 7:
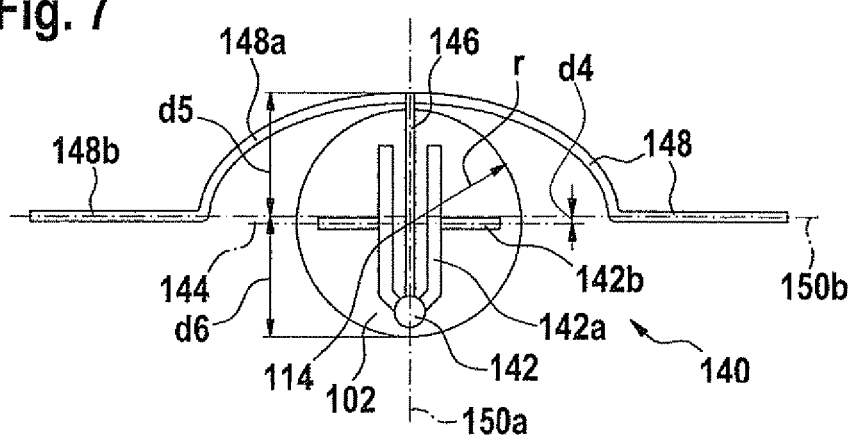
FIG. 7 shows a schematic representation of a fifth specific embodiment of the micromechanical component.

FIG. 7 shows a schematic representation of a fifth specific embodiment of the micromechanical component.

Micromechanical component 140 shown also has mirror plate 102 as setting element. However, a double-limb base element 142 is formed below mirror plate 102. Double-limb base element 142 includes two limbs 142a which are formed in mirror symmetry relative to each other and whose length is somewhat less than double the radius r of mirror plate 102. In addition, supporting elements 142b are formed on the outer sides of both limbs 142a. Supporting elements 142b project perpendicularly in two opposite directions from the two limbs 142a. Preferably, components 142a and 142b are formed in one piece with each other.

Supporting elements 142b may be disposed in such a way with respect to mirror plate 102 that their center longitudinal axes lie on a center axis 144, preferably on an axis of symmetry, of circular mirror plate 102. This ensures a secure retention of mirror plate 102 by base element 142. In particular, the risk of a twisting of mirror plate 102 may be reduced in this manner.

Running between both limbs 142a is a spring 146, preferably a torsion spring, which joins base element 142 to frame mount 148. Frame mount 148 includes an elliptically shaped arch 148a which encircles less than half the circumference of mirror plate 102. Two bar elements 148b are attached to the ends of elliptically shaped arch 148a. The two bar elements 148b extend in two opposite directions away from mirror plate 102.

The center axis of spring 146 defines a first rotational axis 150a, about which mirror plate 102 is rotatable relative to frame mount 148. Correspondingly, the two bar elements 148b define a second rotational axis 150b, about which mirror plate 102 is adjustable, as well. The two rotational axes 150a and 150b are perpendicular relative to each other. Second rotational axis 150b runs parallel to center axis 144 of mirror plate 102.

However, second rotational axis 150b has a distance d4 to center axis 144 unequal to 0. Thus, mirror plate 102 sits slightly offset from second rotational axis 150b. In particular, a distance d5 between second rotational axis 150b and the edge of elliptically shaped arch 148a opposite in direction of mirror plate 102 may be equal to a distance d6 between the second rotational axis and the outer side of mirror plate 102 opposite in direction of elliptically shaped arch 148a. In this case, the maximum deflection of frame mount 148, as well as the mass moment of inertia are able to be limited.

In the exemplary embodiment shown, spring 146 is pulled nearly completely below mirror plate 102. This ensures the advantage described above.

What is claimed is:

1. A method for manufacturing a micromechanical component, comprising:
    forming a first etch stop layer on a base substrate, the first etch stop layer being formed in such a way that it has a first pattern of through-cutouts;
    forming a first electrode-material layer on the first etch stop layer;
    forming a second etch stop layer on the first electrode-material layer, the second etch stop layer being formed in such a way that it has a second pattern of through-cutouts differing from the first pattern;
    forming a second electrode-material layer on the second etch stop layer;
    forming a patterned mask on the second electrode-material layer; and
    carrying out a first etching step in a first direction and a second etching step in a second direction counter to the first direction to etch at least one first electrode unit out of the first electrode-material layer, and to etch at least one second electrode unit out of the second electrode-material layer.

2. The manufacturing method as recited in claim 1, wherein at least one of the first electrode-material layer and the second electrode-material layer is formed as polysilicon layers using an epitaxial deposition process.

3. The manufacturing method as recited in claim 1, wherein at least one of the first etch stop layer and the second etch stop layer is formed of silicone oxide.

4. The manufacturing method as recited in claim 1, wherein the mask on the second electrode-material layer is patterned in such a way that it has a third pattern of through-cutouts differing from the first pattern and the second pattern.

5. The manufacturing method as recited in claim 4, wherein at least one partial surface of the second etch stop layer is formed in such a way that it has equidistantly disposed cutouts having equal extensions, and a distance between the equidistantly disposed cutouts corresponds to width of the electrode fingers of the first electrode unit and the second electrode unit.

6. The manufacturing method as recited in claim 5, wherein at least one partial surface of the first etch stop layer is formed in such a way that it has equidistantly disposed cutouts having equal extensions, and a distance and the extensions of the equidistantly disposed cutouts are determined in such a way that, given a projection of the partial surface of the second etch stop layer onto the partial surface of the first etch stop layer, every second intermediate area between the equidistantly disposed cutouts of the partial surface of the second etch stop layer is projected onto a cutout in the partial surface of the first etch stop layer.

7. The manufacturing method as recited in claim 1, wherein at least one of the first etch stop layer and the second etch stop layer is made of at least one bottom insulating layer, a middle conductive layer which at least partially covers the bottom insulating layer, and a top insulating layer at least partially covering the middle conductive layer.

8. The manufacturing method as recited in claim 7, wherein the middle conductive layer is formed as at least one conductor.

9. The manufacturing method as recited in claim 1, further comprising:
    forming a mirror plate at least partially from the second electrode-material layer, and forming a base element, fixedly disposed on a bottom side of the mirror plate, at least partially from the first electrode-material layer;
    forming a frame mount; and
    forming a spring, via which the mirror plate is joined to the frame mount, at least partially from the first electrode-material layer, the spring being attached to the base element in such a way that the spring runs at least partially along a bottom side of the mirror plate and the mirror plate is adjustable relative to the frame mount.

* * * * *

UNITED STATES PATENT AND TRADEMARK OFFICE
CERTIFICATE OF CORRECTION

PATENT NO.       : 8,687,255 B2                                    Page 1 of 1
APPLICATION NO. : 13/057411
DATED            : April 1, 2014
INVENTOR(S)      : Finkbeiner et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 548 days.

Signed and Sealed this

Twenty-ninth Day of September, 2015

Michelle K. Lee
*Director of the United States Patent and Trademark Office*